United States Patent
Hsu et al.

(10) Patent No.: US 11,177,774 B2
(45) Date of Patent: Nov. 16, 2021

(54) AMPLIFIER DEVICE

(71) Applicant: REALTEK SEMICONDUCTOR CORPORATION, Hsinchu (TW)

(72) Inventors: Heng-Chia Hsu, Hsinchu (TW); Jun Yang, Suzhou (CN)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/868,853

(22) Filed: May 7, 2020

(65) Prior Publication Data

US 2021/0099132 A1    Apr. 1, 2021

(30) Foreign Application Priority Data

Sep. 26, 2019  (CN) .......................... 201910918324.6

(51) Int. Cl.
*H03F 1/02*     (2006.01)
*H03F 3/16*     (2006.01)

(52) U.S. Cl.
CPC ............ *H03F 1/0211* (2013.01); *H03F 3/16* (2013.01); *H03F 2200/21* (2013.01); *H03F 2200/267* (2013.01)

(58) Field of Classification Search
CPC ...... H03F 1/0211; H03F 3/16; H03F 2200/21; H03F 2200/267; H03F 2200/18; H03F 3/20; H03F 1/0261; H03F 2200/513
USPC .......................................... 330/262–273, 296
See application file for complete search history.

(56) References Cited

U.S. PATENT DOCUMENTS

| | | | | |
|---|---|---|---|---|
| 7,920,027 | B2 * | 4/2011 | Keerti | H03F 1/0261 330/264 |
| 8,035,443 | B2 * | 10/2011 | Narathong | H03F 3/3022 330/51 |
| 8,415,991 | B2 | 4/2013 | Rangarajan et al. | |
| 9,964,985 | B1 | 5/2018 | Leong | |

FOREIGN PATENT DOCUMENTS

| TW | 201136163 A1 | 10/2011 |
|---|---|---|
| TW | 201838324 A | 10/2018 |

OTHER PUBLICATIONS

OA letter of the counterpart TW application (appl. no. 108141846) dated May 4, 2020. Summary of the OA letter: 1. Claims 1, 5, and 10 are rejected as allegedly being anticapated by a first cited referecnce (TW 201838324 A, also published as U.S. Pat. No. 9,964,985B1). 2. Claims 2 and 6 are rejected as allegedly being unpatentable over the first cited referecnce. 3. Claims 3-4 and 7-9 are rejected as allegedly being unpatentable over the first cited referecnce in view of a second cited reference (TW 201136163 A1, also published as U.S. Pat. No. 8,415,991B2).

* cited by examiner

*Primary Examiner* — Hieu P Nguyen

(74) *Attorney, Agent, or Firm* — WPAT, PC

(57) ABSTRACT

An amplifier device includes an alternate current (AC) coupling circuit, an amplifier circuit, and a first bias circuit. The amplifier circuit is configured to amplify an input signal to generate an output signal, in which the amplifier circuit includes a first input terminal, and the first input terminal receives the input signal via the AC coupling circuit. The first bias circuit is configured to apply a first bias voltage to the first input terminal according to one of the output signal and a first voltage, such that the amplifier circuit amplifies the input signal to output the output signal.

20 Claims, 5 Drawing Sheets

AMPLIFIER DEVICE

BACKGROUND OF THE INVENTION

1. Field of the Invention

The present disclosure relates to an amplifier device. More particularly, the present disclosure relates to an amplifier device suitable for low voltage applications and bias configurations thereof.

2. Description of Related Art

An amplifier has been widely utilized in various electronic devices, in order to amplify an electrical signal for subsequent signal processing. With development of process technology, a threshold voltage of a transistor becomes higher, and a supply voltage becomes lower. A circuit configuration and a bias configuration of a current amplifier cannot meet requirements of the low voltage applications. If the amplifier is not correctly biased in the low voltage operating environment, a malfunction of the amplifier may be caused, which further results in failure of a system including the amplifier.

SUMMARY OF THE INVENTION

In some embodiments, an amplifier device includes an alternate current (AC) coupling circuit, an amplifier circuit, and a first bias circuit. The amplifier circuit is configured to amplify an input signal to generate an output signal, in which the amplifier circuit includes a first input terminal, and the first input terminal receives the input signal via the AC coupling circuit. The first bias circuit is configured to apply a first bias voltage to the first input terminal according to one of the output signal and a first voltage, such that the amplifier circuit amplifies the input signal to output the output signal.

In some embodiments, an amplifier device includes a first transistor, a second transistor, a first capacitor, a second capacitor, a first resistor, and a second resistor. A first terminal of the first transistor is configured to receive a supply voltage, and a second terminal of the first transistor is configured to generate an output signal. A first terminal of the second transistor is coupled to the second terminal of the first transistor, and a second terminal of the second transistor is coupled to ground. A control terminal of the first transistor receives an input signal via the first capacitor. A control terminal of the second transistor receives the input signal via the second capacitor. The first resistor is configured to apply a first bias voltage to the control terminal of the first transistor according to one of the output signal and a first voltage. The second resistor is configured to apply a second bias voltage to the control terminal of the second transistor according to one of the output signal and a second voltage, in which the first transistor and the second transistor are configured to operate as an inverter-based amplifier according to the first bias voltage and the second bias voltage.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other.

In this document, the term "circuitry" may indicate a system formed with one or more circuits. The term "circuit" may indicate an object, which is formed with one or more transistors and/or one or more active/passive elements based on a specific arrangement, for processing signals. As used herein, the term "and/or" includes any and all combinations of one or more of the associated listed items.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

For ease of understanding, like elements in various figures are designated with the same reference numbers.

Figure 1:
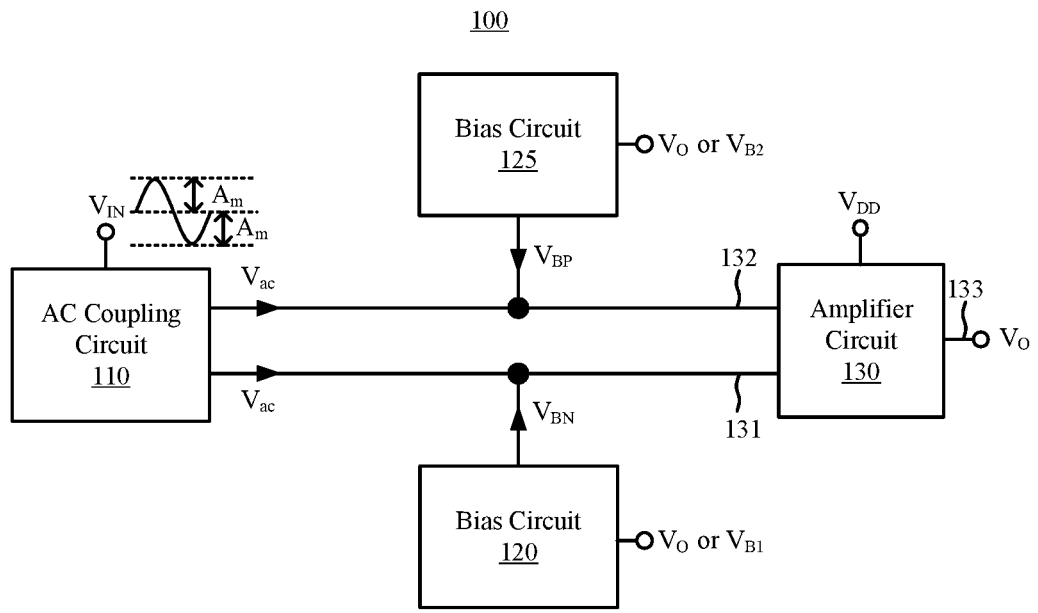
FIG. 1 illustrates a schematic diagram of an amplifier device according to some embodiments of the present disclosure.

FIG. 1 illustrates a schematic diagram of an amplifier device 100 according to some embodiments of the present disclosure. The amplifier device 100 is configured to amplify an input signal $V_{IN}$ to output an output signal $V_O$. In some embodiments, the amplifier device 100 includes an alternating current (AC) coupling circuit 110, a bias circuit 120, a bias circuit 125, and an amplifier circuit 130.

The AC coupling circuit 110 is coupled to input terminals 131 and 132 of the amplifier circuit 130. The AC coupling circuit 110 is configured to receive the input signal $V_{IN}$, and to transmit an AC signal component $V_{ac}$ of the input signal $V_{IN}$ to the amplifier circuit 130. In some embodiments, the AC coupling circuit 110 may be implemented with various types of capacitive networks, in order to reject a direct current (DC) signal component (not shown) of the input signal $V_{IN}$ being transmitted to the amplifier circuit 130.

The bias circuit 120 and the bias circuit 125 are configured to apply a bias voltage $V_{BN}$ to the input terminal 131 and a bias voltage $V_{BP}$ to the input terminal 132 respectively, such that the amplifier circuit 130 is able to operate in a normal operation region to amplify the input signal $V_{IN}$ and outputs the output signal $V_O$. In some embodiments, when the amplifier circuit 130 operates in the normal operation region, various transistors of the amplifier circuit 130 are able to be turned on correctly. In some embodiments, when the amplifier circuit 130 operates in the normal operation region, various transistors of the amplifier circuit 130 operate in a saturation region.

In some embodiments, based on an amplitude $A_m$ of the input signal $V_{IN}$ (and/or a threshold voltage of a transistor in the amplifier circuit 130), the bias circuit 120 is configured to generate the bias voltage $V_{BN}$ according to one of the output signal $V_O$ and a voltage $V_{B1}$. Similarly, based on the amplitude $A_m$ of the input signal $V_{IN}$ (and/or the threshold voltage of the transistor in the amplifier circuit 130), the bias circuit 125 is configured to generate the bias voltage $V_{BP}$ according to one of the output signal $V_O$ and a voltage $V_{B2}$.

The amplifier circuit 130 is powered by a supply voltage $V_{DD}$, and is configured to generate the output signal $V_O$ via an output terminal 133 according to the input signal $V_{IN}$. In greater detail, the amplifier circuit 130 is configured to provide a gain to amplify the AC signal component $V_{ac}$ of the input signal $V_{IN}$ to output the output signal $V_O$. In some embodiments, the amplifier circuit 130 may be an inverter-based amplifier. Alternatively, in some embodiments, the amplifier circuit 130 may include a transconductance stage circuit (e.g., a circuit 615 in FIG. 6A or a circuit 625 in FIG. 6B) and a load circuit (e.g., a circuit 610 in FIG. 6A or a circuit 620 in FIG. 6B). The transconductance stage circuit is configured to generate a current to the load circuit according to the AC signal component $V_{ac}$, and the load circuit converts the current into the output signal $V_O$. In these embodiments, the amplifier circuit 130 may be biased by at least one of the bias circuit 120 and the bias circuit 125.

Figure 2:
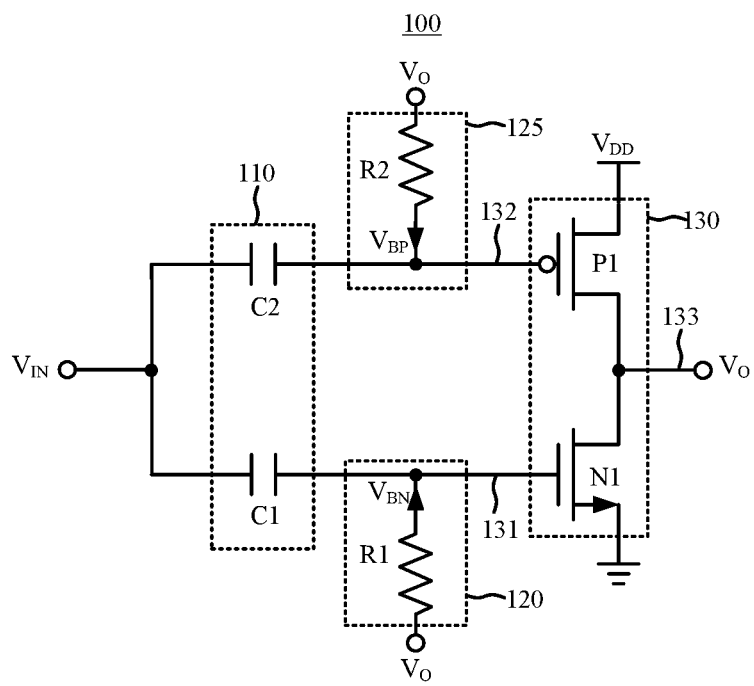
FIG. 2 illustrates a circuit diagram of the amplifier device in FIG. 1 according to some embodiments of the present disclosure.

FIG. 2 illustrates a circuit diagram of the amplifier device 100 in FIG. 1 according to some embodiments of the present disclosure. In this example, the amplifier circuit 130 includes a transistor P1 and a transistor N1. The transistor P1 and the transistor N1 are biased by the bias voltage $V_{BP}$ and the bias voltage $V_{BN}$ respectively, in order to operate as an inverter-based amplifier. A first terminal (e.g., source) of the transistor P1 is configured to receive the supply voltage $V_{DD}$, a second terminal (e.g., drain) of the transistor P1 is coupled to the output terminal 133 of the amplifier circuit 130, and a control terminal (e.g., gate) of the transistor P1 is coupled to the input terminal 132 of the amplifier circuit 130. A first terminal (e.g., drain) of the transistor N1 is coupled to the output terminal 133 of the amplifier circuit 130, a second terminal (e.g., source) of the transistor N1 is coupled to ground, and a control terminal (e.g., gate) of the transistor N1 is coupled to the input terminal 131 of the amplifier circuit 130.

The AC coupling circuit 110 includes a capacitor C1 and a capacitor C2. A first terminal of the capacitor C1 is configured to receive the input signal $V_{IN}$, and a second terminal of the capacitor C1 is coupled to the input terminal 131 of the amplifier circuit 130. A first terminal of the capacitor C2 is configured to receive the input signal $V_{IN}$, and a second terminal of the capacitor C2 is coupled to the input terminal 132 of the amplifier circuit 130.

In this example, the input signal $V_{IN}$ is within a region to enable the transistors P1 and N1 to operate in the normal operation region. For example, "a sum of the amplitude $A_m$ and the bias voltage $V_{BN}$" (which is referred to as "predetermined sum" hereinafter) minus a ground voltage is higher than an absolute value of a threshold voltage of the transistor N1, and the supply voltage $V_{DD}$ minus a difference value determined by subtracting the amplitude $A_m$ from the voltage $V_{BP}$ (which is referred to as "predetermined difference" hereinafter) is higher than an absolute value of a threshold voltage of the transistor P1. Effectively, the transistors P1 and N1 are able to be turned on according to the amplitude $A_m$ of the input signal $V_{IN}$ and the output signal $V_O$. Under this condition, the bias circuit 120 and the bias circuit 125 are configured to generate the bias voltage $V_{BN}$ and the bias voltage $V_{BP}$ according to the output signal $V_O$, respectively.

The bias circuit 120 includes a resistor R1, and the bias circuit 125 includes a resistor R2. A first terminal of the resistor R1 is coupled to the input terminal 131 of the amplifier circuit 130 to output the bias voltage $V_{BN}$, and a second terminal of the resistor R1 is coupled to the output terminal 133 of the amplifier circuit 130 to receive the output signal $V_O$. A first terminal of the resistor R2 is coupled to the output terminal 133 of the amplifier circuit 130 to receive the output signal $V_O$, and a second terminal of the resistor R2 is coupled to the input terminal 132 of the amplifier circuit 130 to output the bias voltage $V_{BP}$. In some embodiments, each of the bias voltage $V_{BN}$ and the bias voltage $V_{BP}$ may be set to a half of the supply voltage $V_{DD}$ (i.e., $0.5 \times V_{DD}$).

Figure 3A:
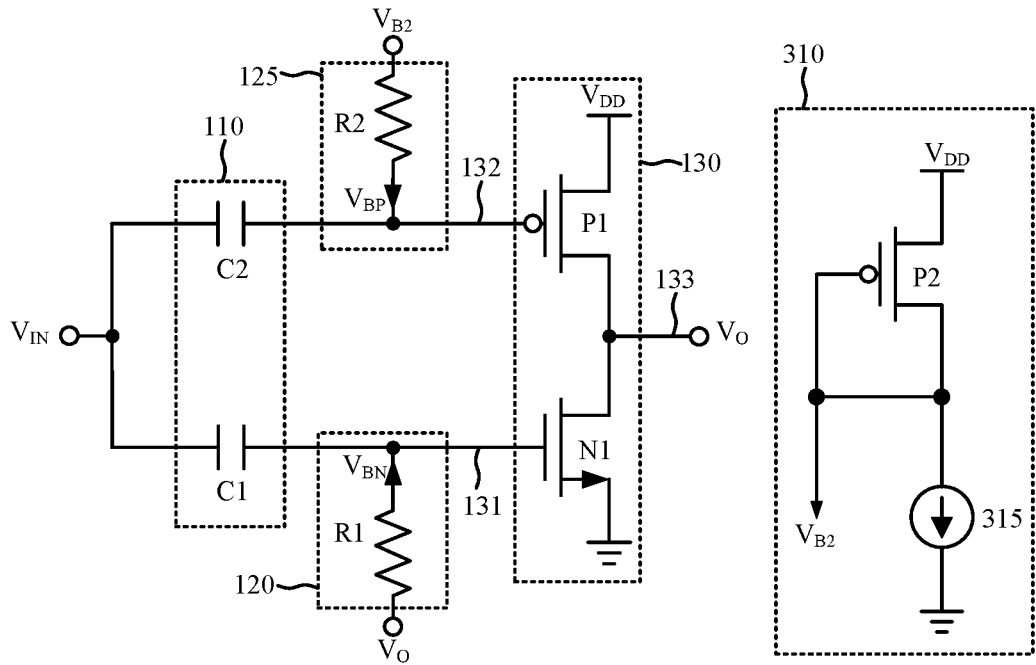
FIG. 3A illustrates a circuit diagram of the amplifier device in FIG. 1 according to some embodiments of the present disclosure.

In certain cases, the input signal $V_{IN}$ may be only sufficient to enable the transistor N1 to operate in the normal operation region (e.g., the transistor N1 may be turned on in response to the (positive) amplitude $A_m$ of the input signal $V_{IN}$), and may be unable to enable the transistor P1 to operate in the normal operation region (e.g., the transistor P1 may not be turned on in response to the (negative) amplitude $A_m$ of the signal $V_{IN}$). For example, the predetermined sum minus the ground voltage may be higher than the absolute value of the threshold voltage of the transistor N1, and the supply voltage $V_{DD}$ minus the predetermined difference may be lower than the absolute value of the threshold voltage of the transistor P1. Under this situation, reference is made to FIG. 3A, and FIG. 3A illustrates a circuit diagram of the amplifier device 100 in FIG. 1 according to some embodiments of the present disclosure. Compared with FIG. 2, in this example, the bias circuit 120 is configured to generate the bias voltage $V_{BN}$ according to the output signal $V_O$, and the bias circuit 125 is configured to generate the bias voltage $V_{BP}$ according to a voltage $V_{B2}$. As a result, the supply voltage $V_{DD}$ minus the predetermined difference is higher than the absolute value of the threshold voltage of the transistor P1, such that the transistor N1 and the transistor P1 are able to operate in the normal operation region at proper timings.

In this example, the amplifier device 100 further includes a voltage generator circuit 310 that is configured to simulate an operating condition (e.g., voltage setting(s), size setting, etc.) of the transistor P1 to generate the voltage $V_{B2}$. For example, the voltage generator circuit 310 includes a transistor P2 and a current source circuit 315. The transistor P2 is configured to be diode-connected and to simulate the operating condition of the transistor P1. The transistor P2 is configured to have certain relevance to the transistor P1. For example, a ratio between a size (e.g., aspect ratio) of the transistor P2 and that of the transistor P1 may be utilized to determine a bias current of the transistor P1. In greater detail, a first terminal (e.g., source) of the transistor P2 is configured to receive the supply voltage $V_{DD}$, a second terminal (e.g., drain) of the transistor P2 is coupled to the current source circuit 315, and a control terminal (e.g., gate) of the transistor P2 is coupled to the second terminal of the transistor P2 and configured to output the voltage $V_{B2}$. The current source circuit 315 is coupled between the second terminal of the transistor P2 and ground, in order to bias the transistor P2. In some embodiments, the current source circuit 315 may be implemented with various current mirror circuits, but the present disclosure is not limited thereto.

Figure 3B:
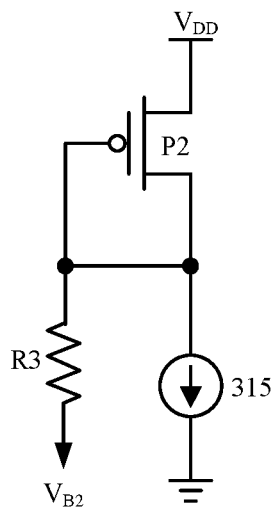
FIG. 3B illustrates another circuit diagram of the voltage generator circuit in FIG. 3A according to some embodiments of the present disclosure.

FIG. 3B illustrates another circuit diagram of the voltage generator circuit 310 in FIG. 3A according to some embodiments of the present disclosure. Compared with FIG. 3A, the voltage generator circuit 310 further includes a resistor R3. A first terminal of the resistor R3 is coupled to the control terminal of the transistor P2, and a second terminal of the resistor R3 is configured to output the voltage $V_{B2}$. The above implementations of the voltage generator circuit 310 are given for illustrative purposes, and the present disclosure is not limited thereto. Various implementations able to generate the voltage $V_{B2}$ are within the contemplated scope of the present disclosure.

Figure 4A:
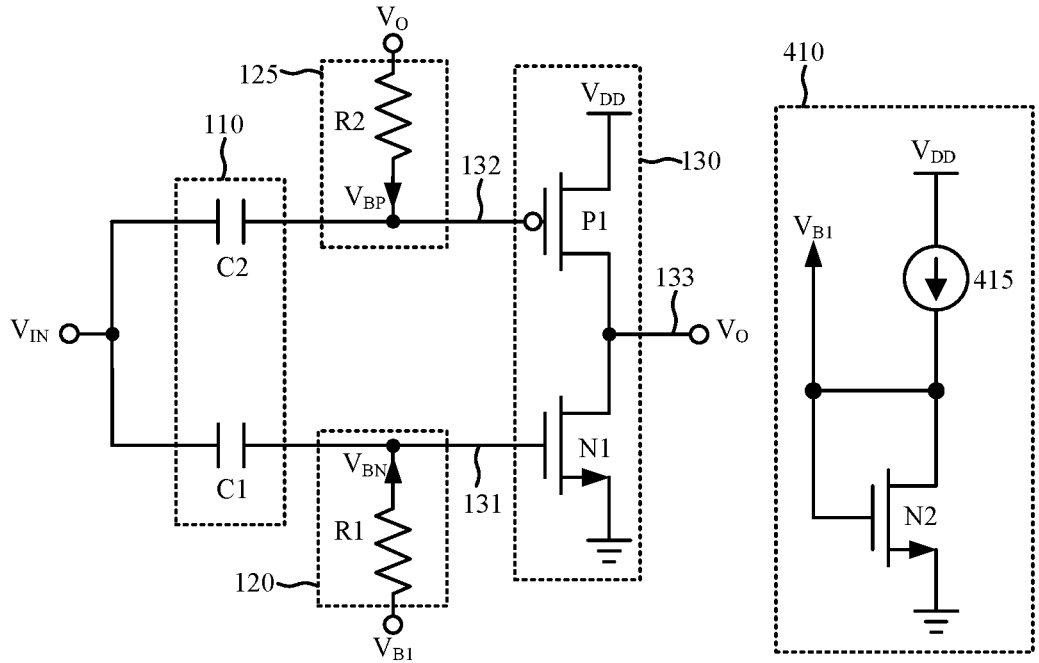
FIG. 4A illustrates a circuit diagram of the amplifier device in FIG. 1 according to some embodiments of the present disclosure.

On the other hand, in certain cases, the input signal $V_{IN}$ may be only sufficient to enable the transistor P1 to operate in the normal operation region (e.g., the transistor P1 may be turned on in response to the (negative) amplitude $A_m$ of the input signal $V_{IN}$), and may be unable to enable the transistor N1 to operate in the normal operation region (e.g., the transistor N1 may not be turned on in response to the (positive) amplitude $A_m$ of the signal $V_{IN}$). For example, the supply voltage $V_{DD}$ minus the predetermined difference is higher than the absolute value of the threshold voltage of the transistor P1, and the predetermined sum minus the ground voltage is lower than the absolute value of the threshold voltage of the transistor N1. Under this condition, reference is made to FIG. 4A, and FIG. 4A illustrates a circuit diagram of the amplifier device 100 in FIG. 1 according to some embodiments of the present disclosure. Compared with FIG. 2, in this example, the bias circuit 125 is configured to generate the bias voltage $V_{BP}$ according to the output signal $V_O$, and the bias circuit 120 is configured to generate the bias voltage $V_{BN}$ according to a voltage $V_{B1}$. As a result, the predetermined sum minus the ground voltage is higher than the absolute value of the threshold voltage of the transistor N1, such that the transistor N1 and the transistor P1 are able to operate in the normal operation region at proper timings.

In this example, the amplifier device 100 further includes a voltage generator circuit 410 that is configured to simulate an operating condition of the transistor N1, in order to generate the voltage $V_{B1}$. In some embodiments, the voltage generator circuit 410 may be a current mirror circuit. For example, the voltage generator circuit 410 includes a transistor N2 and a current source circuit 415. The transistor N2 is configured to be diode-connected, and to simulate the operating condition of the transistor N1. The transistor N2 is configured to have certain relevance to the transistor N1. For example, a ratio between a size of the transistor N2 and that of the transistor N1 may be utilized to determine a bias current of the transistor N1. In greater detail, a first terminal (e.g., drain) of the transistor N2 is coupled to the current source 415, and a second terminal (e.g., source) of the transistor N2 is coupled to ground, and a control terminal (e.g., gate) of the transistor N2 is coupled to the first terminal of the transistor N2 and is configured to output the voltage $V_{B1}$. One terminal of the current source circuit 415 is configured to receive the supply voltage $V_{DD}$, and another terminal of the current source circuit 415 is coupled to the first terminal of the transistor N2, in order to bias the transistor N2. In some embodiments, the current source circuit 415 may be implemented with various current mirror circuits, but the present disclosure is not limited thereto.

Figure 4B:
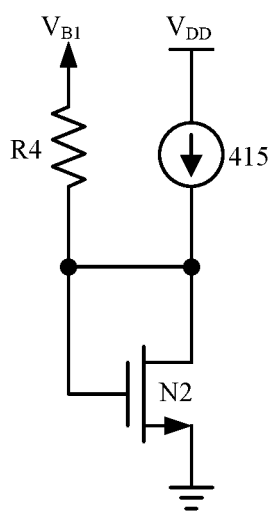
FIG. 4B illustrates another circuit diagram of the voltage generator circuit in FIG. 4A according to some embodiments of the present disclosure.

FIG. 4B illustrates another circuit diagram of the voltage generator circuit 410 in FIG. 4A according to some embodiments of the present disclosure. Compared with FIG. 4A, in this example, the voltage generator circuit further includes a resistor R4. A first terminal of the resistor R4 is configured to output the bias voltage $V_{B1}$, and a second resistor R4 is coupled to the control terminal of the transistor N2. The above arrangements of the voltage generator circuit 410 are given for illustrative purposes only, and the present disclosure is not limited thereto. Various arrangements of the voltage generator circuit 410 are within the contemplated scope of the present disclosure.

Figure 5:
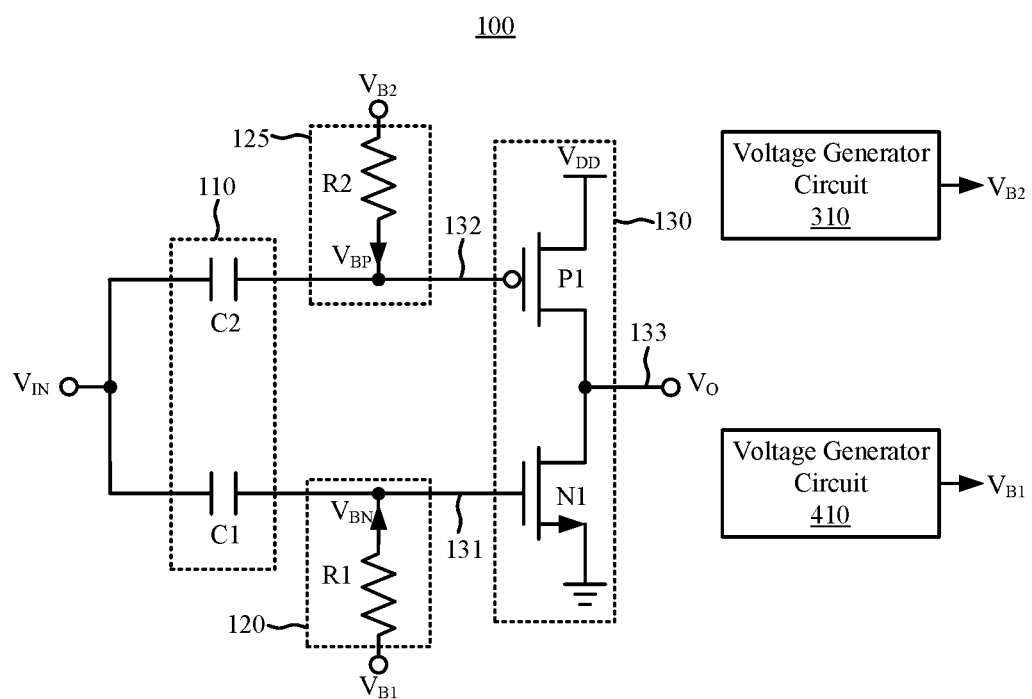
FIG. 5 illustrates a circuit diagram of the amplifier device in FIG. 1 according to some embodiments of the present disclosure.

Moreover, in certain cases, the input signal $V_{IN}$ may be unable to enable the transistors N1 and P1 to operate in the normal operation region (e.g., the transistor N1 may not be turned on in response to the (positive) amplitude $A_m$ of the input signal $V_{IN}$, and the transistor P1 may not be turned on in response to the (negative) amplitude $A_m$ of the signal $V_{IN}$). For example, the predetermined sum minus the ground voltage is lower than the absolute value of the threshold voltage of the transistor N1, and the supply voltage VDD minus the predetermined difference is lower than the absolute value of the threshold voltage of the transistor P1. Under this condition, reference is made to FIG. 5, and FIG. 5 illustrates a circuit diagram of the amplifier device 100 in FIG. 1 according to some embodiments of the present disclosure. Compared with FIG. 2, in this example, the amplifier device 100 includes the voltage generator circuit 310 and the voltage generator circuit 410. The bias circuit 120 is configured to generate the bias voltage $V_{BN}$ according to the voltage $V_{B1}$, and the bias circuit 125 is configured to generate the bias voltage $V_{BP}$ according to the voltage $V_{B2}$. As a result, the predetermined sum minus the ground voltage is able to be higher than the absolute value of the threshold voltage of the transistor N1, and the supply voltage $V_{DD}$ minus the predetermined difference is able to be higher than the absolute value of the threshold voltage of the transistor P1. Accordingly, the transistor N1 and the transistor P1 are able to operate in the normal operation region at proper timings. The arrangements of the voltage generator circuit 310 and those of the voltage generator circuit 410 can be understood with reference to the previous embodiments, and thus the repetitious descriptions are not given herein.

Figure 6A:
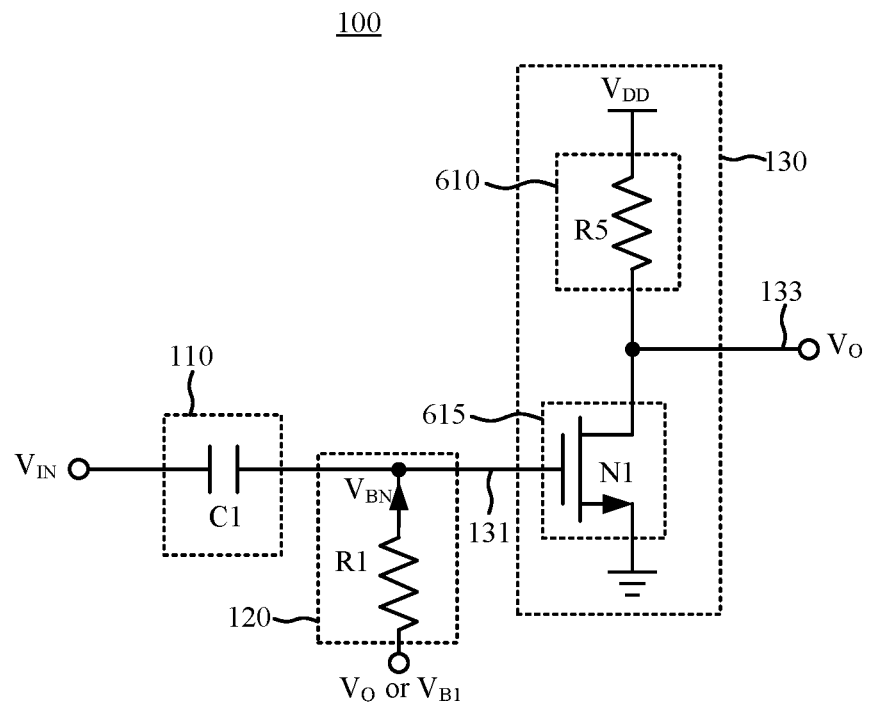
FIG. 6A illustrates a circuit diagram of the amplifier device in FIG. 1 according to some embodiments of the present disclosure.

FIG. 6A illustrates a circuit diagram of the amplifier device 100 in FIG. 1 according to some embodiments of the present disclosure. In this example, the amplifier circuit 130 excludes the input terminal 132 and includes a load circuit 610 and a transconductance stage circuit 615. The transconductance stage circuit 615 is configured to cooperate with the load circuit 610, in order to generate the output signal $V_O$ according to the input signal $V_{IN}$. For example, the transconductance stage circuit 615 may include the transistor N1, and the load circuit 610 may include a resistor R5. A first terminal of the resistor R5 is configured to receive the supply voltage $V_{DD}$, and a second terminal of the resistor R5 is coupled to the output terminal 133 of the amplifier circuit 130. The arrangement of the transistor N1 is similar to the aforementioned embodiments, and thus the repetitious descriptions are not given herein.

In this example, the amplifier device 100 may only include the bias circuit 120, in order to bias the gate of the transistor N1. Similar to the aforementioned embodiments, the bias circuit 120 may be configured to generate the bias voltage $V_{BN}$ according to the output signal $V_O$ or the voltage $V_{B1}$, in order to bias the input terminal 131 of the amplifier circuit 130.

Figure 6B:
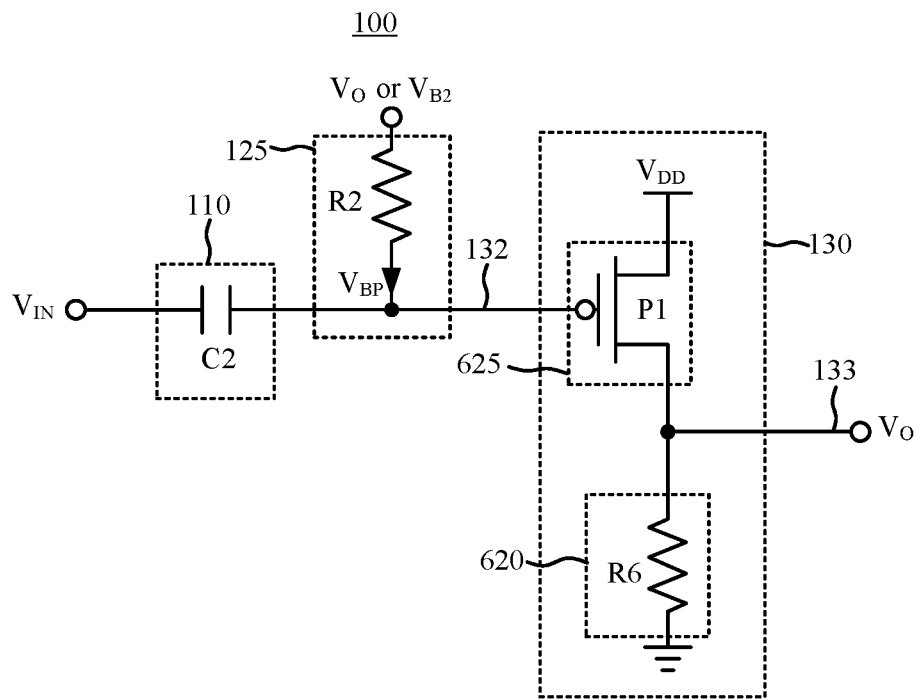
FIG. 6B illustrates a circuit diagram of the amplifier device in FIG. 1 according to some embodiments of the present disclosure.

FIG. 6B illustrates a circuit diagram of the amplifier device 100 in FIG. 1 according to some embodiments of the present disclosure. In this example, the amplifier circuit 130 excludes the input terminal 131 and includes a load circuit 620 and a transconductance stage circuit 625. The transconductance stage circuit 625 is configured to cooperate with the load circuit 620, in order to generate the output signal $V_O$ according to the input signal $V_{IN}$. For example, the transconductance stage circuit 625 may include the transistor P1, and the load circuit 610 may include a resistor R6. A first terminal of the resistor R6 is coupled to the output terminal 133 of the amplifier circuit 130, and a second terminal of the resistor R6 is coupled to ground. The arrangement of the transistor P1 is similar to the aforementioned embodiments, and thus the repetitious descriptions are not given herein.

In this example, the amplifier device 100 may only include the bias circuit 125, in order to bias the gate of the transistor P1. Similar to the aforementioned embodiments, the bias circuit 125 may be configured to generate the bias voltage $V_{BN}$ according to the output signal $V_O$ or the voltage $V_{B2}$, in order to bias the input terminal 132 of the amplifier circuit 130.

In some embodiments, the transistors N1 and N2 may be N-type transistors, and the transistors P1 and P2 may be P-type transistors. In some embodiments, the aforementioned transistors may be implemented with metal-oxide-semiconductor field-effect transistors (MOSFETs), but the present disclosure is mot limited thereto. Various types of transistors able to implement similar operations are within the contemplated scope of the present disclosure.

The above embodiments are given with examples of using single-ended circuit(s), but the present disclosure is not limited thereto. It should be understood that the above embodiments are able to be implemented with differential circuit(s).

As described above, the amplifier device provided in some embodiments of the present disclosure has multiple bias configurations, and thus is suitable for low voltage applications and is able to be implemented with advanced process.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. An amplifier device, comprising:
    an alternate current (AC) coupling circuit;
    an amplifier circuit configured to amplify an input signal to generate an output signal, wherein the amplifier circuit comprises a first input terminal and a first transistor coupled to the first input terminal, and the first input terminal receives the input signal via the AC coupling circuit; and
    a first bias circuit configured to receive one of the output signal directly from the amplifier circuit and a first voltage based on whether the first transistor is not turned on in response to an amplitude of the input signal, in order to apply a first bias voltage to the first input terminal to bias the first transistor according to the received one of the output signal and the first voltage, such that the amplifier circuit amplifies the input signal to output the output signal.

2. The amplifier device of claim 1, wherein the first transistor is configured to be biased by the first bias voltage, in order to generate the output signal according to the input signal, and the first bias circuit is configured to output the first bias voltage according to the output signal.

3. The amplifier device of claim 1, wherein the first transistor is configured to be biased by the first bias voltage, in order to generate the output signal according to the input signal, and if the first transistor is not turned on in response to the amplitude of the input signal and the output signal, the first bias circuit is configured to output the first bias voltage according to the first voltage.

4. The amplifier device of claim 3, further comprising:
    a voltage generator circuit configured to simulate an operating condition of the first transistor, in order to generate the first voltage.

5. The amplifier device of claim 1, wherein the amplifier circuit further comprises a second input terminal, the second input terminal receives the input signal via the AC coupling circuit, the amplifier circuit further comprises a second transistor, the first transistor and the second transistor are configured to be respectively biased by the first bias voltage and a second bias voltage, in order to generate the output signal according to the input signal, and the amplifier device further comprises:
    a second bias circuit configured to apply the second bias voltage to the second input terminal according to one of the output signal and a second voltage, such that the amplifier circuit amplifies the input signal to output the output signal.

6. The amplifier device of claim 5, wherein the first bias circuit is configured to output the first bias voltage according to the output signal, and the second bias circuit is configured to output the second bias voltage according to the output signal.

7. The amplifier device of claim 5, wherein the first bias circuit is configured to output the first bias voltage according to the output signal, and if the second transistor is not turned on in response to the amplitude of the input signal and the output signal, the second bias circuit is configured to output the second bias voltage according to the second voltage.

8. The amplifier device of claim 5, wherein if the first transistor and the second transistor are not turned on in response to the amplitude of the input signal and the output signal, the first bias circuit is configured to output the first bias voltage according to the first voltage, and the second bias circuit is configured to output the second bias voltage according to the second voltage.

9. The amplifier device of claim 8, further comprising:
a first voltage generator circuit configured to simulate an operating condition of the first transistor, in order to generate the first voltage; and
a second voltage generator circuit configured to simulate an operating condition of the second transistor, in order to generate the second voltage.

10. The amplifier device of claim 5, wherein the first transistor and the second transistor are configured to operate as an inverter-based amplifier according to the first bias voltage and the second bias voltage.

11. The amplifier device of claim 5, wherein the second bias circuit is configured to output the second bias voltage according to the output signal, and if the first transistor is not turned on in response to the amplitude of the input signal and the output signal, the first bias circuit is configured to output the first bias voltage according to the first voltage.

12. An amplifier device, comprising:
a first transistor, wherein a first terminal of the first transistor is configured to receive a supply voltage, and a second terminal of the first transistor is configured to generate an output signal;
a second transistor, wherein a first terminal of the second transistor is coupled to the second terminal of the first transistor, and a second terminal of the second transistor is coupled to ground;
a first capacitor, wherein a control terminal of the first transistor receives an input signal via the first capacitor;
a second capacitor, wherein a control terminal of the second transistor receives the input signal via the second capacitor;
a first resistor configured to receive one of the output signal directly from the first transistor and a first voltage based on whether the first transistor is not turned on in response to an amplitude of the input signal, in order to apply a first bias voltage to the control terminal of the first transistor according to the received one of the output signal and the first voltage; and
a second resistor configured to apply a second bias voltage to the control terminal of the second transistor according to one of the output signal and a second voltage, wherein the first transistor and the second transistor are configured to operate as an inverter-based amplifier according to the first bias voltage and the second bias voltage.

13. The amplifier device of claim 12, wherein the first resistor is configured to output the first bias voltage according to the output signal, and the second resistor is configured to the second bias voltage according to the output signal.

14. The amplifier device of claim 12, wherein the first resistor is configured to output the first bias voltage according to the output signal, and if the second transistor is not turned on in response to the amplitude of the input signal and the output signal, the second resistor is configured to output the second bias voltage according to the second voltage.

15. The amplifier device of claim 12, wherein the second resistor is configured to output the second bias voltage according to the output signal, and if the first transistor is not turned on in response to the amplitude of the input signal and the output signal, the first resistor is configured to output the first bias voltage according to the first voltage.

16. The amplifier device of claim 12, wherein if the first transistor and the second transistor are not turned on in response to the amplitude of the input signal and the output signal, the first resistor is configured to output the first bias voltage according to the first voltage, and the second resistor is configured to output the second bias voltage according to the second voltage.

17. The amplifier device of claim 12, further comprising:
a third transistor configured to simulate an operating condition of the first transistor, wherein a first terminal of the third transistor is configured to receive the supply voltage, and a second terminal of the third transistor is coupled to a control terminal of the third transistor, in order to output the first voltage; and
a first current source circuit coupled between the third transistor and ground.

18. The amplifier device of claim 17, further comprising:
a third resistor, wherein a first terminal of the third resistor is coupled to the control terminal of the third transistor, and a second another terminal of the third resistor is configured to output the first voltage.

19. The amplifier device of claim 12, further comprising:
a fourth transistor configured to simulate an operating condition of the second transistor, wherein a first terminal of the fourth transistor is coupled to a control terminal of the fourth transistor, in order to output the second voltage, and a second terminal of the fourth transistor is coupled to ground; and
a second current source circuit, wherein a terminal of the second current source circuit is configured to receive the supply voltage, another terminal of the second current source circuit is coupled to the first terminal of the fourth transistor.

20. The amplifier device of claim 19, further comprising:
a fourth resistor, wherein a first terminal of the fourth resistor is coupled to the control terminal of the fourth transistor, and a second terminal of the fourth resistor is configured to output the second voltage.

* * * * *